(12) United States Patent
Graydon et al.

(10) Patent No.: US 7,649,254 B2
(45) Date of Patent: Jan. 19, 2010

(54) CONDUCTIVE STIFFENER FOR A FLEXIBLE SUBSTRATE

(75) Inventors: Bhret Graydon, San Jose, CA (US); Steve Frandrup, Hampton, MN (US)

(73) Assignee: Flextronics AP, LLC, Broomfield, CO (US)

( * ) Notice: Subject to any disclaimer, the term of this patent is extended or adjusted under 35 U.S.C. 154(b) by 80 days.

(21) Appl. No.: 11/381,093

(22) Filed: May 1, 2006

(65) Prior Publication Data

US 2007/0254117 A1 Nov. 1, 2007

(51) Int. Cl.
*H01L 23/49* (2006.01)

(52) U.S. Cl. ................. 257/710; 257/E23.065

(58) Field of Classification Search .............. None
See application file for complete search history.

(56) References Cited

U.S. PATENT DOCUMENTS

| | | | | |
|---|---|---|---|---|
| 5,724,230 A * | 3/1998 | Poetzinger | ................. | 361/758 |
| 5,877,543 A * | 3/1999 | Matsubara et al. | .......... | 257/674 |
| 6,208,022 B1 * | 3/2001 | Tamura | .................. | 257/692 |
| 6,335,563 B1 * | 1/2002 | Hashimoto | ................. | 257/632 |
| 6,570,250 B1 * | 5/2003 | Pommer | .................. | 257/731 |
| 6,734,535 B1 * | 5/2004 | Hashimoto | ................. | 257/668 |
| 6,833,614 B2 * | 12/2004 | Higuchi | ................. | 257/691 |
| 6,953,999 B2 * | 10/2005 | Strandberg et al. | .......... | 257/778 |
| 2001/0013654 A1 * | 8/2001 | Kalidas et al. | ............. | 257/738 |
| 2002/0061609 A1 * | 5/2002 | Hashimoto | ................. | 438/131 |
| 2002/0063331 A1 * | 5/2002 | Honda | .................. | 257/737 |
| 2003/0173663 A1 * | 9/2003 | Kami et al. | ................. | 257/728 |
| 2004/0099958 A1 * | 5/2004 | Schildgen et al. | .......... | 257/778 |
| 2004/0195701 A1 * | 10/2004 | Attarwala | .................. | 257/783 |
| 2008/0073777 A1 * | 3/2008 | Cui et al. | .................. | 257/707 |

* cited by examiner

*Primary Examiner*—Minh-Loan T Tran
*Assistant Examiner*—Benjamin P Sandvik
(74) *Attorney, Agent, or Firm*—Robert G. Crouch; Bobby B. Soltani; Marsh Fischmann & Breyfogle, LLP

(57) ABSTRACT

A structure is disclosed for connecting an electrically-connectable metal stiffener to a ground connection within a flexible substrate, the stiffener comprising nickel-gold plated stainless steel. In one embodiment the stiffener is secured to the flexible substrate by a non-conducting adhesive which includes an opening over a ground connection, the adhesive opening being filled by a conductive epoxy. A sequence for applying the disclosed materials discloses a method for attaching the stiffening structure to the flexible substrate.

17 Claims, 3 Drawing Sheets

CONDUCTIVE STIFFENER FOR A FLEXIBLE SUBSTRATE

BACKGROUND

In consumer electronic products, the thickness and or volume of the product is a very important sales factor. The thickness is termed "Z-stackup". Flexible printed circuit boards are the material of choice for component mounting and interconnect due to low cost and thin Z-stackup. In some cases a flexible printed circuit board requires a rigid area for mounting certain components to the flexible printed circuit board. Some products, for example cell phones, need a low ohmic resistance (a maximum of two ohms for some customers) means for the common grounding of electrically conducting components and subsystems. Ideally the grounding means should provide for the design of a Faraday cage around all except the radiating portion of the antenna. For example, in a cell phone, a camera module must provide for its external grounding to the phone chassis or other components. Some applications require the provision of an electrically active ground pad to the bottom side of the imager at the flexible printed circuit board level. This to be done with little or no increase in Z-stackup.

FR4, a common printed circuit board material, has been used in the past as an interconnect material with a folded over conducting tab, but this adds material thickness and increases Z-stackup. Metal stiffeners are a competitive edge, as they provide rigidity and planarity not available in standard material sets and offer a reduced package size in Z-stackup. But there has been no satisfactory solution for an electrically active ground connection to the back side of the stiffener.

In a cell phone, conductive materials which are floating (relative to the electrical potential of portions of the circuitry in the phone) can disturb the proper loading of an antenna, leading to poor radio connectivity. This can result in poor user satisfaction and potentially high return rates. Electrically unconnected metal in close proximity of noisy signals or components can couple and amplify noise within cell phone applications, affecting performance. In addition, corrosion susceptible metals or ferrous metals are not allowed in cell phone applications. Nickel-gold plated stainless steel can provide a thin, rigid, non-corroding and non-oxidizing stiffener, providing there is suitable means for attaching the stiffener to the flexible printed circuit board. Currently available conductive adhesives may provide low resistance as-assembled, but resistance increases as a result of reflow. Thus the industry has a need for a reliable, near-zero ohm connection of a flexible printed circuit board ground-to-metal-stiffener solution.

SUMMARY

This section summarizes some features of the invention. Other features are described in the subsequent sections.

In the method of the present invention a sandwich including insulating, conductive, adhesive, flexible, and inflexible materials provides stiffening for a certain area of a mostly flexible substrate wherein all electrical and/or conducting components are provided a path for an electrical connection to a common voltage potential, for example ground. In addition, the invention provides for a connection point wherein other components not associated with the flexible substrate may also be electrically connected to the flexible substrate, providing, for example, a common electrical ground.

A flexible substrate, also termed a flexible printed circuit board ("FPC"), having been prepatterned with metal lines (for example copper) and optionally other shielding and/or insulating materials, receives an application of an adhesive material. The adhesive material has good adhesion characteristics, but may be an inadequate electrical conductor, especially after reflow processing. The adhesive material is patterned or prepatterned in a tape form factor, wherein the pattern includes one or more openings over an electrically conducting area of the FPC. The location of the opening in the adhesive is generally coincidental with an opening through an insulating layer over the FPC, the opening in the insulating area being over a portion of a metal line on the FPC where a desired electrical potential will be provided when the finished assembly is in use. A conductive epoxy is put into the two aforementioned coincidental openings. A nickel-gold plated stainless steel stiffener, approximately the same size and shape as the outer limits of the adhesive area, is placed over the epoxy and adhesive areas. The entire assembly is then pressed together with heat and pressure applied, which provides for an approximately flat and coplanar sandwich and also cures the adhesive and the epoxy materials. The resulting assembly provides a flat, rigid area onto the FPC suitable for mounting other components on the FPC approximately aligned with the stiffener on the opposing side of the FPC. The gold plating of the stiffener provides a good electrical connection area, free of corrosion and oxidation, which may be used by other components in the system, within which the FPC assembly is integrated, for making electrical contact with the stiffener, hence with the FPC.

In another aspect of the invention, a structure includes a flexible circuit board populated with a plurality of conductive lines; a layer of adhesive applied to the flexible circuit board, the layer defining an opening over at least one area of the flexible circuit board; electrically-conductive material located in the opening in the adhesive layer; and a metal stiffener adhered to the structure by the adhesive layer and electrically connected to the at least one area of the flexible circuit board by contact with the electrically-conductive material.

DESCRIPTION OF SOME EMBODIMENTS

The embodiments described in this section illustrate but do not limit the invention. The invention is not limited to any particular material, pressure, temperature, time, or other parameters.

Figure 1:
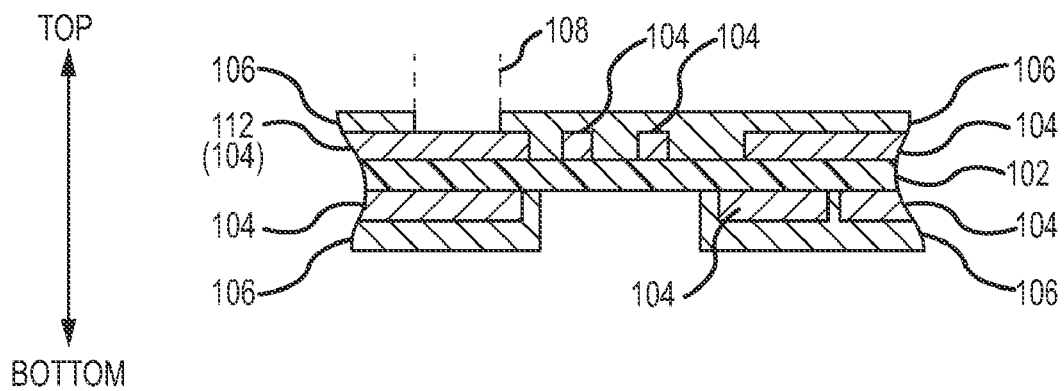
FIG. 1 is an example of a flexible printed circuit board subassembly including an optional insulating layer, further processed in accordance with one embodiment of the present invention.

Referring to FIG. 1, a flexible printed circuit board ("FPC") 102, which is known in the art, has prepatterned metal, for example copper, lines and connection points, for example copper lines 104 and 112. In some embodiments a solder mask layer 106 electrically insulates the metal lines from undesired electrical connection to other metal lines due to contamination, solder splatter, poor pattern imaging, and the like. When a solder mask layer 106 is used it may also improve the planarity of the area to which it is applied. If a solder mask 106 is used, it is patterned with an opening 108 over a desired area of a metal line 112. The solder mask method of patterning and material are known in the art, for example Taiyo America PSR4000 solder mask. The selection of the desired location of the opening is typically to provide for a connection to a certain potential path on the FPC, for example a ground plane.

Figure 2:
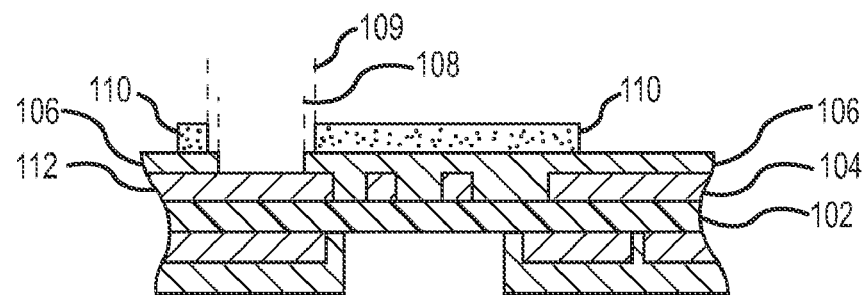
FIG. 2 shows the subassembly of FIG. 1, further including an adhesive layer.

Looking to FIG. 2, an adhesive 110, such as a thermal set adhesive ("TSA") adhesive tape Pyralux from DuPont, is applied to the top (as defined in FIG. 1) of the solder mask 106. In one embodiment the TSA is the product A381 from Sheldahl. The TSA 110 is prepatterned with an opening 109 that is generally coincidental with the solder mask 106 opening 108. The opening 109 in the TSA 110 may be the same size or larger than the opening 108 in the optional solder mask 106. The TSA is not sticky as-received. The TSA is pressed against (and made to adhere to) the solder mask 106 by pressing the subassembly including the TSA with a flat surface which is heated to approximately 220 degrees F. for a short time, for example fifteen seconds, under approximately 300 psi. This provides for intimate contact between the TSA 110 and the solder mask 106 and also removes any air bubbles. Other times, temperatures, and pressures may be specified by the manufacturer of the adhesive employed. The TSA 110 need not be electrically conductive, but in one embodiment an electrically conductive adhesive 110 is used.

Figure 3:
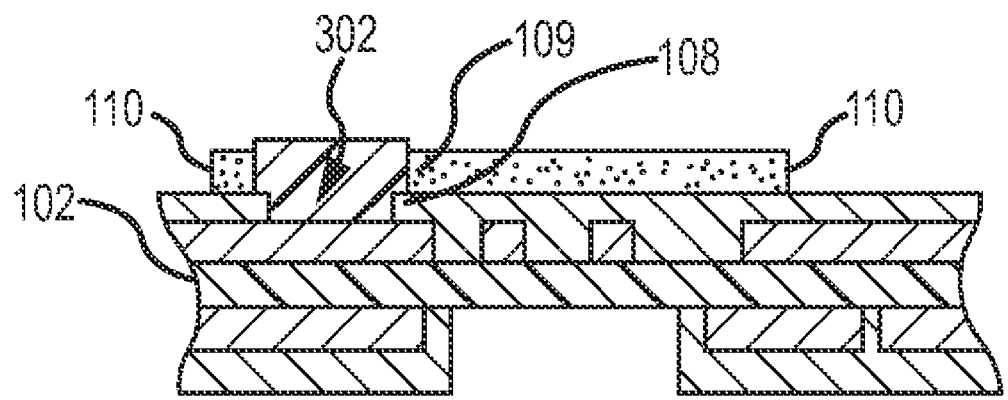
FIG. 3 shows the subassembly of FIG. 2, further including an epoxy application.

Referring to FIG. 3, a conductive epoxy 302, for example silver filled epoxy XCE3104XL from Emerson & Cuming, is put into the combined openings 108 and 109. The conductive epoxy 302 may be screened on, stenciled, dispensed as a drop, or otherwise applied as is known in the art. The volume of the conducting epoxy 302 may be slightly greater, for example 105 percent, than the volume of the cavity created by the openings 108 and 109.

Figure 4:
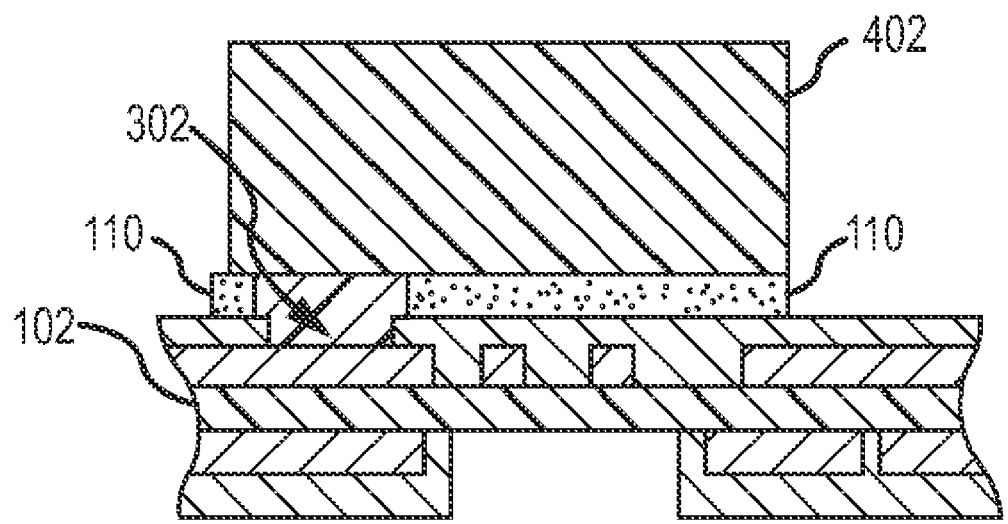
FIG. 4 shows a completed assembly comprising the stiffening structure materials in accordance with one embodiment of the present invention.

Looking now to FIG. 4, a stiffener 402, for example nickel-gold plated 302 type or 304 type stainless steel, is placed over the TSA 110. The stiffener 402 is large enough and positioned so as to cover the TSA 110 and the conductive epoxy 302. The stiffener 402 has been previously electroplated with nickel and gold. In one embodiment the nickel-gold plating is on both sides of the stiffener. In one embodiment the nickel is sulfamate nickel, with a thickness of approximately 50 to 100 microinches. The gold thickness is approximately three to five microinches, and is applied over the underlying nickel. In one embodiment the stainless steel stiffener 402 is about 4 to 12 mils in thickness. Electroplated nickel-gold stainless steel may be obtained from many vendors as a commodity material and custom formed to be the desired size and shape in planform.

The sandwich of materials previously described is placed into a press, such as a platen press, with the side of the subassembly holding the stiffener 402 facing a heated hard surface of the press. The press heats the sandwich at a temperature recommended by the manufacturers of the TSA 110 and the epoxy 302 to fully cure the TSA 110 and the epoxy 302, for example 340 degrees F. for an hour or more. To make the press available for pressing additional assemblies, in one embodiment of the present invention the assembly is removed from the press before complete curing and is placed into an oven for final curing.

Figure 5:
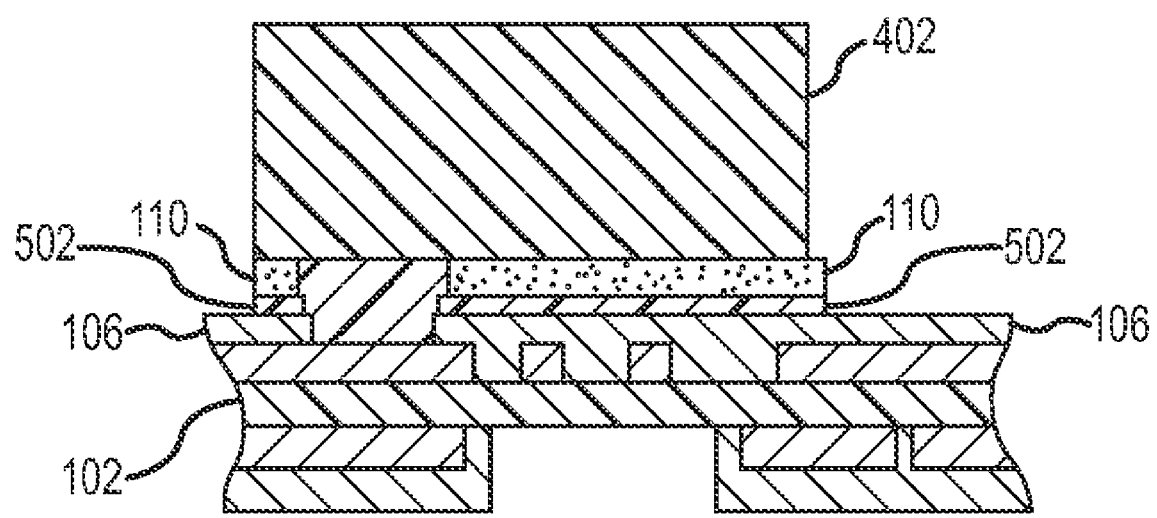
FIG. 5 shows a completed assembly similar to the assembly of FIG. 4 with the addition of an emissions shield.

In some embodiments an electrical emissions shielding material, such as silver shielding film, is placed between the solder mask 106 layer and the TSA 110 layer. The shielding material may be grounded by various means, such as an opening coincidental with the openings 108 and 109 or by an electrical connection with a metal line. Examples of a shielding material are silver shielding films PC 1000 or PC5000 from Tatsuta. An example of a structure including one embodiment with the optional shielding material 502 layer may be seen in FIG. 5.

PC1000 and PC5000 are trademarks of Taiyo America, Inc, and the products may be obtained by contacting Taiyo America at 2675 Antler Drive, Carson City, Nev. 89701. Pyralux is a trademark of DuPont, and the product may be obtained by contacting DuPont Flexible Circuit Materials, 14 T. W. Alexander Drive, Research Park, N.C. 27709. XCE3104XL is a trademark of Emerson & Cuming, and the product may be obtained by contacting Emerson & Cuming at 46 Manning Road, Billerica, Mass., 01821. A381 is a trademark of Sheldahl, and the product may be obtained by contacting Sheldahl at 1150 Sheldahl Road, Northfield, Minn., 55057.

The invention is not limited to the embodiments described above. The invention is not limited to combining all of the techniques described above. Some embodiments use less than all of the techniques described above. Also, one or more of the techniques described above can be combined with other techniques.

RESERVATION OF EXTRA-PATENT RIGHTS, RESOLUTION OF CONFLICTS, AND INTERPRETATION OF TERMS

After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, art works or other works provided herein, and to trademark or trade dress rights that may be associated with coined terms or art works provided herein and to other otherwise-protectable subject matter included herein or otherwise derivable herefrom.

Unless expressly stated otherwise herein, ordinary terms have their corresponding ordinary meanings within the respective contexts of their presentations, and ordinary terms of art have their corresponding regular meanings.

We claim:

1. A structure for providing rigidity to an area of less than all of the area of a flexible substrate, the structure comprising:
   a first adhesive over a certain area of the flexible substrate, the first adhesive having an opening over an electrical conducting portion of the flexible substrate and adhering to a portion of the structure that is adjacent to a lower surface of the first adhesive;
   an electrically insulating layer between the first adhesive and the flexible substrate, wherein the electrically insulating layer includes an opening approximately located under the opening of the first adhesive, the opening of the electrically insulating layer approximating the size of the opening of the first adhesive;
   an electrically conducting layer between the first adhesive and the electrically insulating layer, wherein the electrically conducting layer includes an opening approximately located under the opening of the first adhesive, the opening of the electrically conducting layer approximating the size of the opening of the first adhesive;

a second adhesive within a cavity defined by the opening of the first adhesive, wherein the second adhesive is electrically conducting, and wherein the second adhesive is disposed over and adjacent to the electrically conducting portion of the flexible substrate; and a stiffener adhered to the structure by both the first and the second adhesive, wherein the stiffener is in contact with each of the first and second adhesives.

2. The structure according to claim 1, wherein the first adhesive is a thermal set adhesive tape.

3. The structure according to claim 1, wherein the second adhesive is a metal filled epoxy.

4. The structure according to claim 3, wherein the metal of the second adhesive is silver.

5. The structure according to claim 1, wherein the stiffener includes metal.

6. The structure according to claim 1, wherein the stiffener includes stainless steel.

7. The structure according to claim 6, wherein the stainless steel stiffener further includes nickel electroplating.

8. The structure according to claim 7, wherein the nickel plated stainless steel stiffener further includes gold electroplating.

9. The structure according to claim 7, wherein the electroplated nickel thickness is approximately fifty to one hundred microinches.

10. The structure according to claim 7, wherein the nickel electroplating is sulfamate nickel.

11. The structure according to claim 8, wherein the electroplated gold thickness is at least approximately three microinches.

12. A structure, comprising:
a flexible circuit board populated with a plurality of conductive lines;
a layer of adhesive over the flexible circuit board, the layer of adhesive defining an opening over at least one area of the flexible circuit board, the at least one area being electrically-conductive;
an electrically insulating layer between the adhesive layer and the flexible circuit board, wherein the electrically insulating layer includes an opening approximately located under the opening of the adhesive layer, the opening of the electrically insulating layer approximating the size of the opening of the adhesive layer;
an electrically conducting layer between the adhesive and the electrically insulating layer, wherein the electrically conducting layer includes an opening approximately located under the opening of the adhesive, the opening of the electrically conducting layer approximating the size of the opening of the adhesive;
electrically-conductive material located in the openings in the adhesive layer and the electrically insulating layer, wherein the electrically-conductive material is disposed over and adjacent to the at least one area of the flexible circuit board; and
a metal stiffener adhered to the structure by the adhesive layer and electrically connected to the at least one area of the flexible circuit board by contact with the electrically-conductive material.

13. The structure according to claim 12, wherein the adhesive is a thermal set adhesive tape.

14. The structure according to claim 12, wherein the stiffener approximately covers the layer of adhesive.

15. The structure according to claim 12, wherein pressure and heat are used to adhere the adhesive to the electrical insulating layer and the metal stiffener.

16. The structure according to claim 1, wherein the stiffener approximately covers the first adhesive.

17. A structure for providing rigidity to an area of less than all of the area of a flexible substrate, the structure comprising:
a first adhesive over a certain area of the flexible substrate, the first adhesive having an opening over an electrical conducting portion of the flexible substrate;
an electrically insulating layer between the first adhesive and the flexible substrate, wherein the electrically insulating layer includes an opening approximately located under the opening of the first adhesive, the opening of the electrically insulating layer approximating the size of the opening of the first adhesive;
an electrically conducting layer between the first adhesive and the electrically insulating layer, wherein the electrically conducting layer includes an opening approximately located under the opening of the first adhesive, the opening of the electrically conducting layer approximating the size of the opening of the first adhesive;
a second adhesive within a cavity defined by the openings of the first adhesive, the electrically insulating layer, and the electrically conducting layer, wherein the second adhesive is electrically conducting, and wherein the second adhesive is disposed over and adjacent to the electrically conducting portion of the flexible substrate; and
a stiffener over the first and the second adhesive.

* * * * *